(12) United States Patent
Kamiyama

(10) Patent No.: US 10,832,994 B2
(45) Date of Patent: Nov. 10, 2020

(54) ELECTRONIC MODULE

(71) Applicant: SHINDENGEN ELECTRIC MANUFACTURING CO., LTD., Tokyo (JP)

(72) Inventor: Yoshihiro Kamiyama, Hanno (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 309 days.

(21) Appl. No.: 15/761,776

(22) PCT Filed: Dec. 13, 2016

(86) PCT No.: PCT/JP2016/086997
§ 371 (c)(1),
(2) Date: Mar. 20, 2018

(87) PCT Pub. No.: WO2018/109820
PCT Pub. Date: Jun. 21, 2018

(65) Prior Publication Data
US 2020/0243425 A1 Jul. 30, 2020

(51) Int. Cl.
*H01L 23/495* (2006.01)
*H01L 23/48* (2006.01)
(Continued)

(52) U.S. Cl.
CPC .. *H01L 23/49562* (2013.01); *H01L 23/49524* (2013.01); *H01L 23/49575* (2013.01);
(Continued)

(58) Field of Classification Search
CPC .......... H01L 23/49503; H01L 23/3107; H01L 23/49562; H01L 23/49524;
(Continued)

(56) References Cited

U.S. PATENT DOCUMENTS 5,877,937 A * 3/1999 Shibata ............. H01L 23/49568
174/16.3
6,177,720 B1 * 1/2001 Ichikawa .......... H01L 23/49568
257/670
(Continued)

FOREIGN PATENT DOCUMENTS

EP 2677539 A1 12/2013
EP 2674973 A1 12/2018
(Continued)

OTHER PUBLICATIONS

From NL 2020161 Search Report and Search Opinion, dated Aug. 28, 2018 with machine English translation provided by NL patent office.
(Continued)

*Primary Examiner* — Alonzo Chambliss
(74) *Attorney, Agent, or Firm* — Ladas & Parry, LLP

(57) ABSTRACT

An electronic module has a sealing part 90; electronic elements 15, 25 provided in the sealing part 90; back-surface exposed conductors 10, 20, 30 having back-surface exposed parts 12, 22, 32, which have back surfaces exposed from the sealing part 90, and having one-terminal parts 11, 21, 31, which extend from the back-surface exposed parts 12, 22, 32 and protrude outward from a side of the sealing part 90; and back-surface unexposed conductors 40, 50 having unexposed parts 42, 52, which are sealed in the sealing part 90, and having other-terminal parts 41, 51, which extend from the unexposed parts 42, 52 and protrude outward from a side of the sealing part 90. The electronic elements 15, 25 are placed on the back-surface exposed parts 12, 22, 32. The other-terminal parts 41, 51 have a width narrower than a width of the one-terminal parts 11, 21, 31.

6 Claims, 13 Drawing Sheets

(51) Int. Cl.
*H01L 21/00* (2006.01)
*H01L 23/00* (2006.01)

(52) U.S. Cl.
CPC .............. *H01L 24/37* (2013.01); *H01L 24/40* (2013.01); *H01L 24/45* (2013.01); *H01L 24/48* (2013.01); *H01L 2224/40245* (2013.01); *H01L 2224/48151* (2013.01)

(58) Field of Classification Search
CPC ... H01L 23/49575; H01L 24/37; H01L 24/40; H01L 24/45; H01L 24/48
See application file for complete search history.

(56) References Cited

U.S. PATENT DOCUMENTS

| | | | |
|---|---|---|---|
| 8,471,417 B2 | 6/2013 | Fujita et al. | |
| 2009/0072334 A1* | 3/2009 | Saitoh | B29C 45/14655 257/415 |
| 2009/0294934 A1* | 12/2009 | Shi | H01L 23/49524 257/670 |
| 2014/0110752 A1* | 4/2014 | Fujino | H01L 23/488 257/133 |
| 2014/0203423 A1 | 7/2014 | Hayashi | |
| 2015/0131232 A1* | 5/2015 | Ishino | H01L 25/07 361/707 |
| 2017/0301633 A1 | 10/2017 | Toshiyuki et al. | |

FOREIGN PATENT DOCUMENTS

| | | |
|---|---|---|
| JP | 5067679 B2 | 11/2012 |
| JP | 2012243890 A | 12/2012 |
| JP | 2014047362 A | 3/2014 |
| JP | 2014139968 A | 7/2014 |
| JP | 2016076563 A | 5/2016 |
| NL | 2018487 A | 9/2017 |
| WO | 2017154199 A1 | 9/2017 |

OTHER PUBLICATIONS

International Search Report for PCT/JP2016/086997, dated Mar. 7, 2017, and its English translation provided by Google Translate.
International Preliminary Examination Report (Chapter II)for PCT/JP2016/086997, dated Nov. 28, 2017, and its English translation provided by Google Translate.
Written Opinion for PCT/JP2016/086997, dated Mar. 7, 2017, and its English translation provided by Google Translate.

* cited by examiner

ELECTRONIC MODULE

CROSS-REFERENCE TO RELATED APPLICATION

The present application is the U.S. national phase of PCT Application PCT/JP2016/086997 filed on Dec. 13, 2016, the disclosure of which is incorporated herein by reference in its entirety.

TECHNICAL FIELD

The present invention relates to an electronic module.

BACKGROUND ART

An electronic module used for an inverter circuit or a relay circuit employed in a vehicle, such as an automobile, has been known in the art. Japanese Patent No. 5067679 discloses an electronic module having a power terminal, an output terminal, and a ground terminal.

It is preferable for such an electronic module to enhance the efficiency of heat dissipation from an electronic element. Thus, it is conceivable that the entire back surface of a base end part integrated with a terminal part will be exposed from a sealing part of mold resin and the like. However, it is highly possible that the base end part, which is integrated with the terminal part having a narrow width, might slip off the sealing part when the entire back surface of the base end part is exposed from the sealing part. In addition, it is difficult to hold the base end part having a narrow width when sealing with resin, and thus poor appearance of the base end part might be caused by burr that occurs at the sealing part.

SUMMARY OF INVENTION

Technical Problem

In consideration of the above, the present invention provides an electronic module that can reduce the possibility of a conductor, which includes a terminal part, getting out of a sealing part, and also the possibility of poor appearance of the conductor caused by burr that occurs at the sealing part.

Solution to Problem

An electronic module according to the present embodiment may comprise:
a sealing part;
an electronic element provided in the sealing part;
a back-surface exposed conductor having a back-surface exposed part, which has a back surface exposed from the sealing part, and having a one-terminal part, which extends from the back-surface exposed part and protrudes outward from a side of the sealing part; and
a back-surface unexposed conductor having an unexposed part, which is sealed in the sealing part, and having an other-terminal part, which extends from the unexposed part and protrudes outward from a side of the sealing part; wherein
the electronic element is placed on the back-surface exposed part, and
the other-terminal part has a width narrower than the width of a one-terminal part.

In the electronic module according to the present embodiment, an inward bent part may be provided between the back-surface exposed part and the one-terminal part, and bend toward inside of the sealing part.

In the electronic module according to the present embodiment, the back-surface exposed part may have a first back-surface exposed part on which the electronic element is placed, the one-terminal part may have a first terminal part extended from the first back-surface exposed part, and the first terminal part and the other-terminal part may protrude outward from one side of the sealing part.

In the electronic module according to the present embodiment, a plurality of the first terminal parts may be provided, the other-terminal part may have a fourth terminal part and a fifth terminal part, and one each of the fourth terminal part and the fifth terminal part may be provided between at least a pair of the first terminal parts.

In the electronic module according to the present embodiment, a plurality of the first back-surface exposed parts may be provided, at least one the unexposed part may be provided between at least a pair of the first back-surface exposed parts.

In the electronic module according to the present embodiment, the back-surface exposed part may have a second back-surface exposed part on which the electronic element is placed and a third back-surface exposed part on which the electronic element is not placed, the one-terminal part may have a second terminal part extended from the second back-surface exposed part, and has a third terminal part extended from the third back-surface exposed part, and the second terminal part and the third terminal part may protrude outward from another side of the sealing part.

In the electronic module according to the present embodiment, the second terminal part and the third terminal part may be alternately arranged.

Advantageous Effects of Invention

In the present invention, heat dissipation effect can be expected since the back-surface exposed part, on which the electronic element is placed, have the back surface exposed. On the contrary, the possibility of the back-surface unexposed conductor getting out of the sealing part can be reduced since the unexposed part is sealed in the sealing part. Poor appearance of the unexposed part is not caused by burr of the sealing part since the unexposed parts is not exposed from the back surface. The other-terminal part is sealed in the sealing part, while the electronic element is placed on the back-surface exposed part having exposed back surfaces. As a result, the other-terminal part can be separated from the electronic element in the thickness direction. This can prevent current flowing through the other-terminal part from being adversely affected by heat generated by the electronic element.

DESCRIPTION OF EMBODIMENTS

Embodiment

<<Configuration>>

Figure 3:
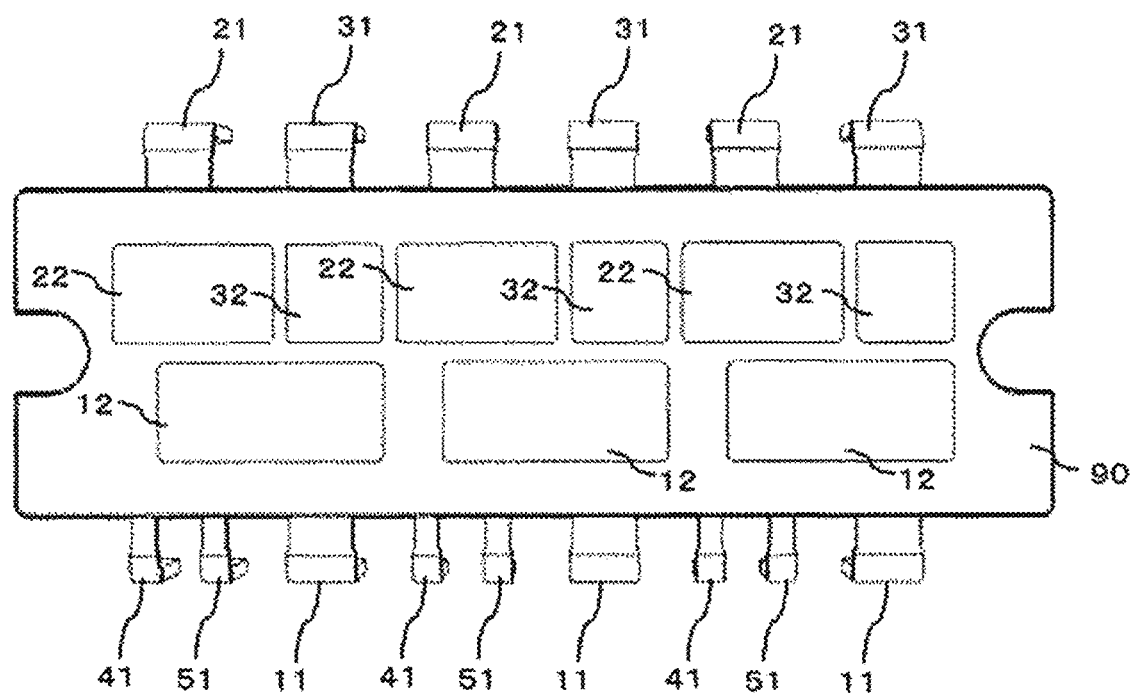
FIG. 3 is a bottom plan view of the electronic module according to the embodiment of the present invention.
Figure 4:
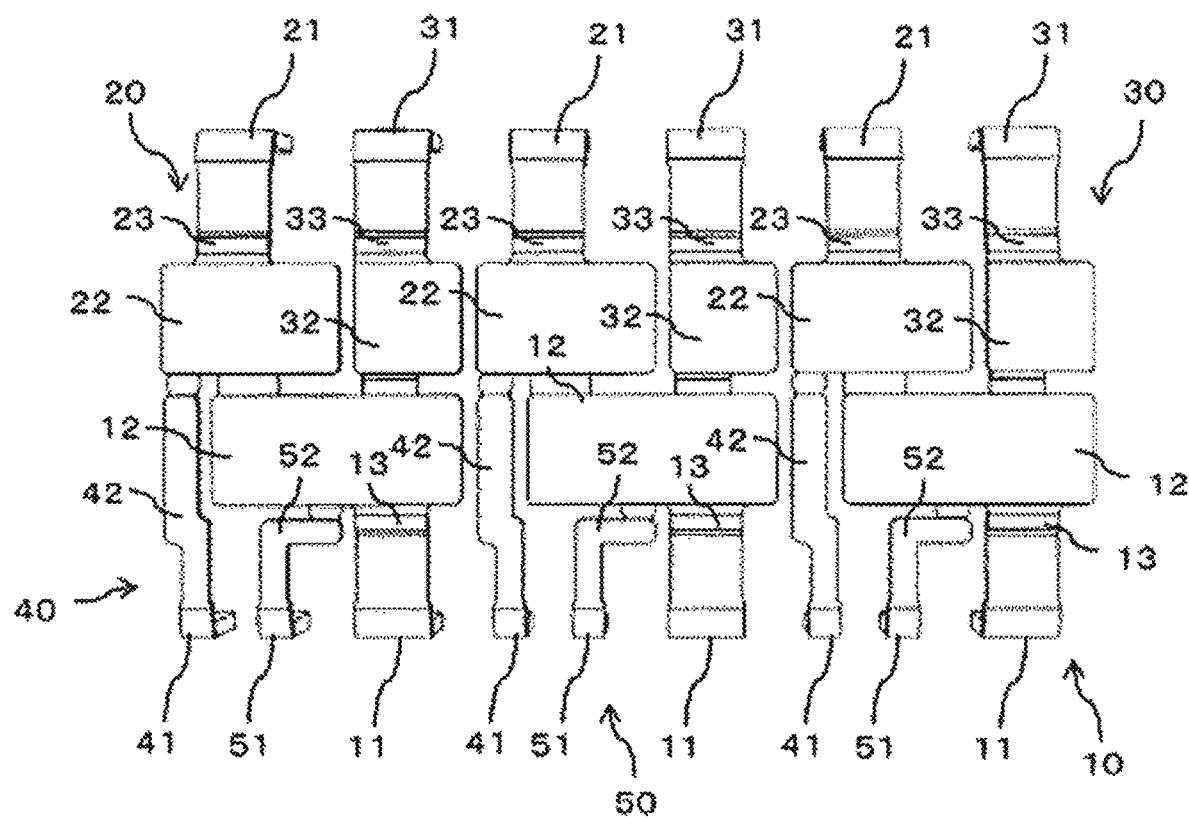
FIG. 4 is a bottom plan view of the electronic module shown in FIG. 3 from which the sealing part has been removed.

As shown in FIGS. 3 and 4, an electronic module according to the present embodiment has a sealing part 90 (see FIG. 1), a plurality of electronic elements 15 and 25 provided in the sealing part 90 (see FIG. 5), back-surface exposed conductors 10, 20, and 30, and back-surface unexposed conductors 40 and 50. The back-surface exposed conductors 10, 20, and 30 have back-surface exposed parts 12, 22, and 32, respectively, each of which has a back surface exposed from the sealing part 90, and also have one-terminal parts 11, 21, and 31, respectively, which extend from the back-surface exposed parts 12, 22, and 32 and protrude outward from the side of the sealing part 90. The back-surface unexposed conductors 40 and 50 have unexposed parts 42 and 52, respectively, which are sealed in the sealing part 90, and also have other-terminal parts 41 and 51, respectively, which extend from the unexposed parts 42 and 52 and protrude outward from the side of the sealing part 90.

Figure 5:
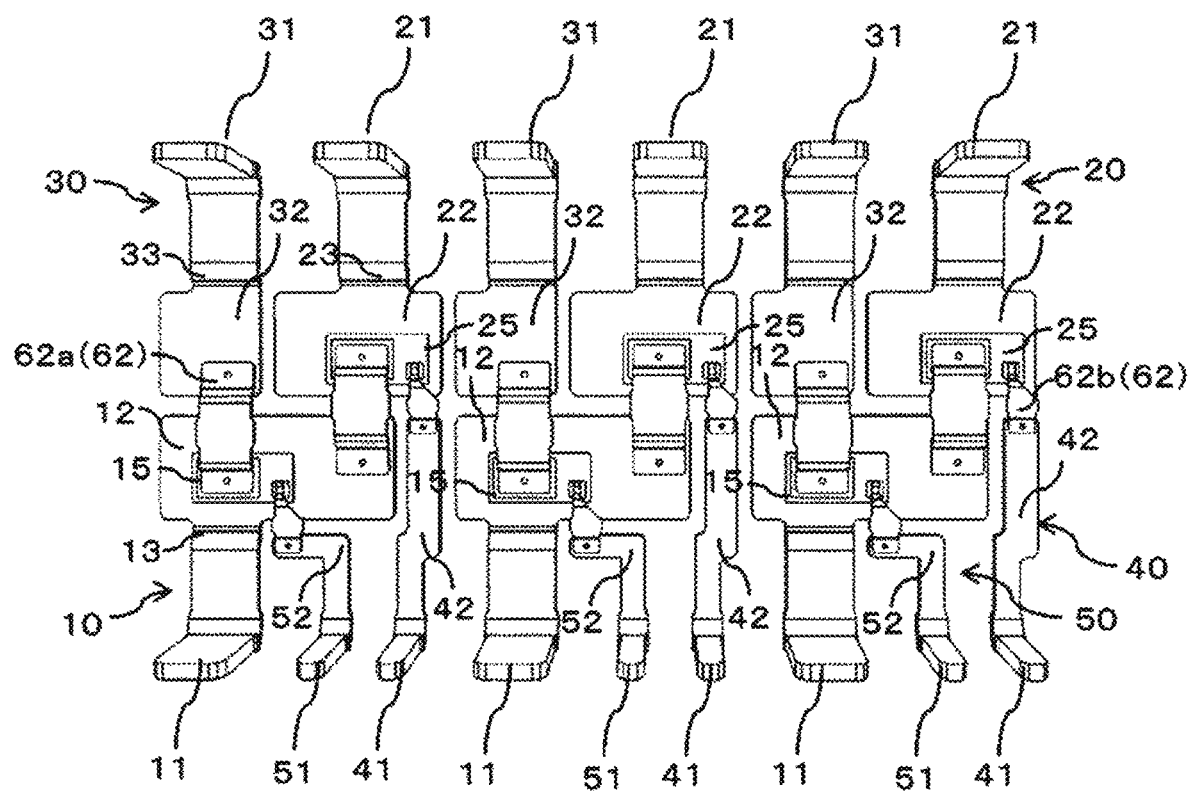
FIG. 5 is a plan view of the electronic module according to the embodiment of the present invention, from which the sealing part has been removed.
Figure 13:
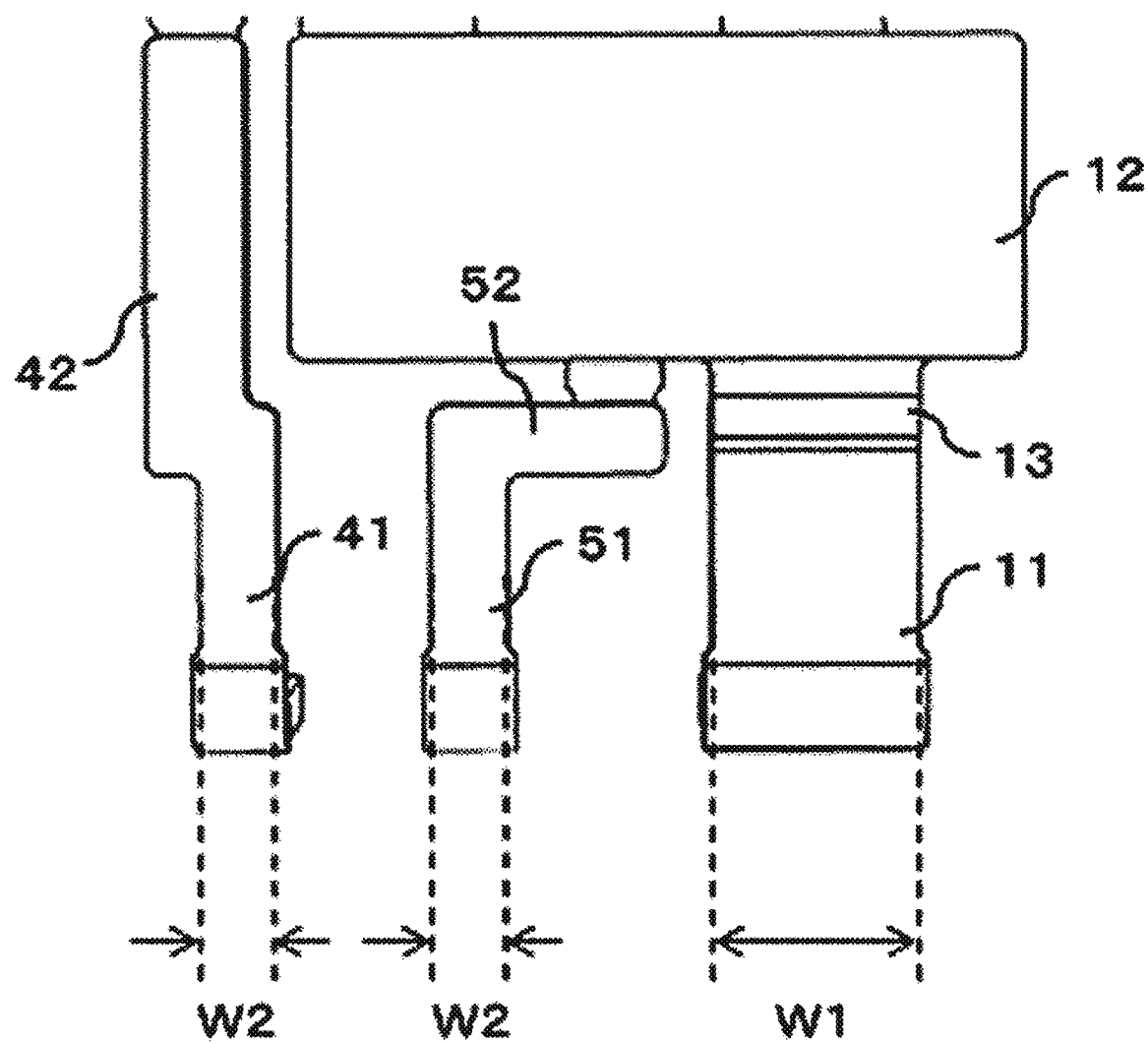
FIG. 13 is a bottom plan view for illustrating an example of comparison between the width of a one-terminal part and the width of an other-terminal part.

The electronic elements 15 and 25 may be placed on the back-surface exposed parts 12, 22, and 32 (see FIG. 5). The other-terminal parts 41 and 51 may have a width narrower than the width of the one-terminal parts 11, 21 and 31. For example, a width W2 of the other-terminal parts 41 and 51 may be one third to one half of a width W1 of the one-terminal parts 11, 21 and 31 (see FIG. 13).

The electronic elements 15 and 25 are, for example, semiconductor elements, and the electronic module is, for example, a semiconductor module. The present embodiment will be described by citing an aspect, in which the back-surface exposed parts 12, 22, and 32 are integrated with the one-terminal parts 11, 21 and 31, respectively, and the unexposed parts 42 and 52 are integrated with the other-terminal parts 41 and 51, respectively. However, the present embodiment is not limited to the above aspect. The unexposed parts 42 and 52 and the other-terminal parts 41 and 51 may be provided separately and be bonded to each other.

As shown in FIG. 5, the electronic elements 15 and 25 may have a first electronic element 15, which is placed on a first back-surface exposed part 12, and a second electronic element 25, which is placed on a second back-surface exposed part 22. The back-surface exposed parts 12, 22, and 32 may have the first back-surface exposed part 12 on which the first electronic element 15 is placed. The one-terminal parts 11, 21 and 31 may have a first terminal part 11 integrated with the first back-surface exposed part 12. As shown in FIG. 3, the first terminal part 11 and the other-terminal parts 41 and 51 may protrude outward from one side (the lower side shown in FIG. 3) of the sealing part 90.

It is possible to provide a plurality of the first back-surface exposed parts 12 and the first terminal parts 11. The other-terminal parts 41 and 51 may have a fourth terminal part 41 and a fifth terminal part 51. The other-terminal parts 41 and 51 may be provided between at least a pair of the first back-surface exposed parts 12. One each of the fourth terminal part 41 and the fifth terminal part 51 may be provided between a pair of the first terminal parts 11. According to an aspect shown in FIG. 4, a first unexposed part 42 integrated with the fourth terminal part 41 is provided between a pair of the first back-surface exposed parts 12, and a second unexposed part 52 integrated with the fifth terminal part 51 is provided at one side (the lower side shown in FIG. 4) of the first back-surface exposed part 12. The other-terminal parts 41 and 51 may be connected to the electronic elements 15 and 25, respectively. According to an aspect shown in FIG. 5, the fifth terminal part 51 is connected to the first electronic element 15 via a connector 62, and is used to control the first electronic element 15. The fourth terminal part 41 is connected to the second electronic element 25 via a connector 62, and is used to control the second electronic element 25.

As shown in FIG. 5, the back-surface exposed parts 12, 22, and 32 may have a third back-surface exposed part 32 on which the electronic elements 15 and 25 are not placed, and a second back-surface exposed part 22 on which the second electronic element 25 is placed. The one-terminal parts 11, 21 and 31 may have a second terminal part 21 integrated with the second back-surface exposed part 22, and a third terminal part 31 integrated with the third back-surface exposed part 32. As shown in FIG. 3, the second terminal part 21 and the third terminal part 31 may protrude outward from another side (the upper side shown in FIG. 3) of the sealing part 90. The second terminal part 21 and the third terminal part 31 may be alternately arranged.

The back-surface exposed conductors 10, 20, and 30 may have a first back-surface exposed conductor 10 having the first back-surface exposed part 12 and the first terminal part 11, a second back-surface exposed conductor 20 having the second back-surface exposed part 22 and the second terminal part 21, and a third back-surface exposed conductor 30 having the third back-surface exposed part 32 and the third terminal part 31, respectively (see FIG. 4). The back-surface unexposed conductors 40 and 50 may have a first back-surface unexposed conductor 40 having the fourth terminal part 41 and the first unexposed part 42, and a second back-surface unexposed conductor 50 having the fifth terminal part 51 and the second unexposed part 52, respectively.

Figure 6:
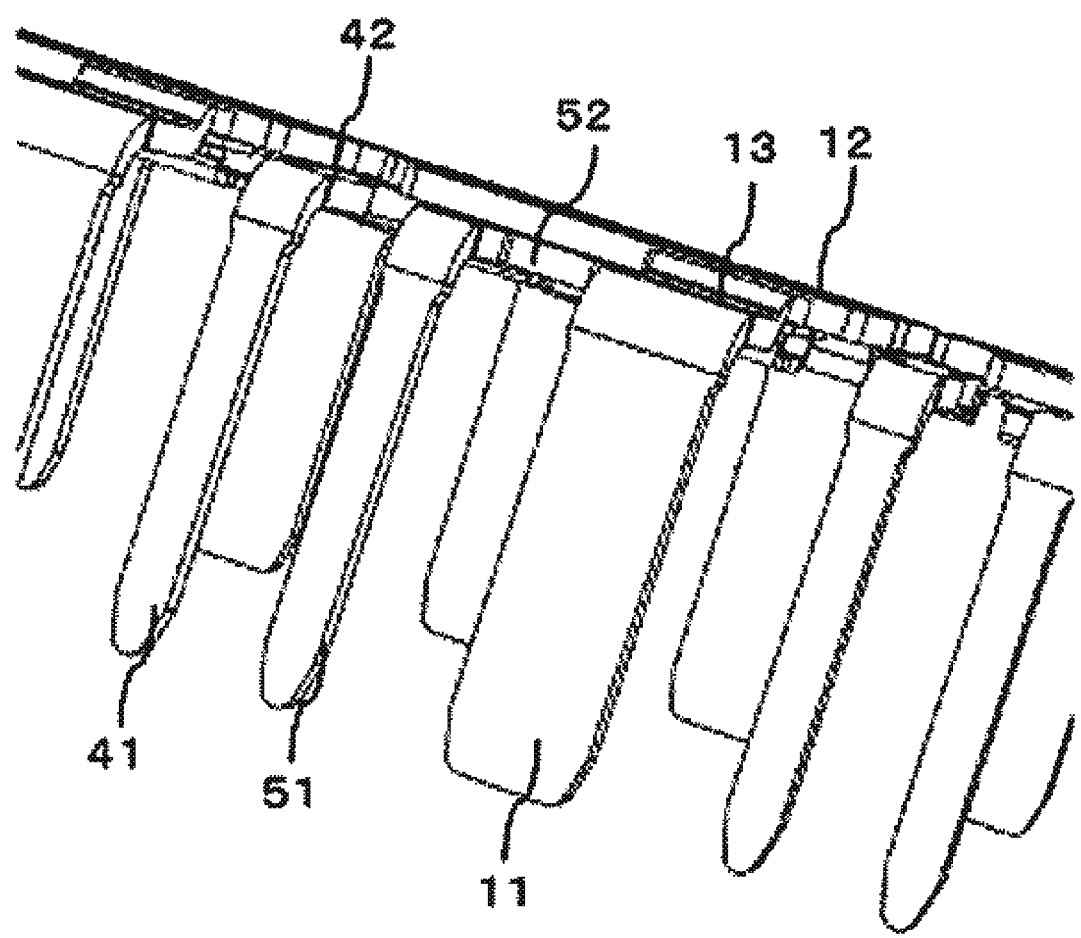
FIG. 6 is a perspective view for illustrating a relationship among components including a first terminal, a fourth terminal, and a fifth terminal of the electronic module according to the embodiment of the present invention.
Figure 7:
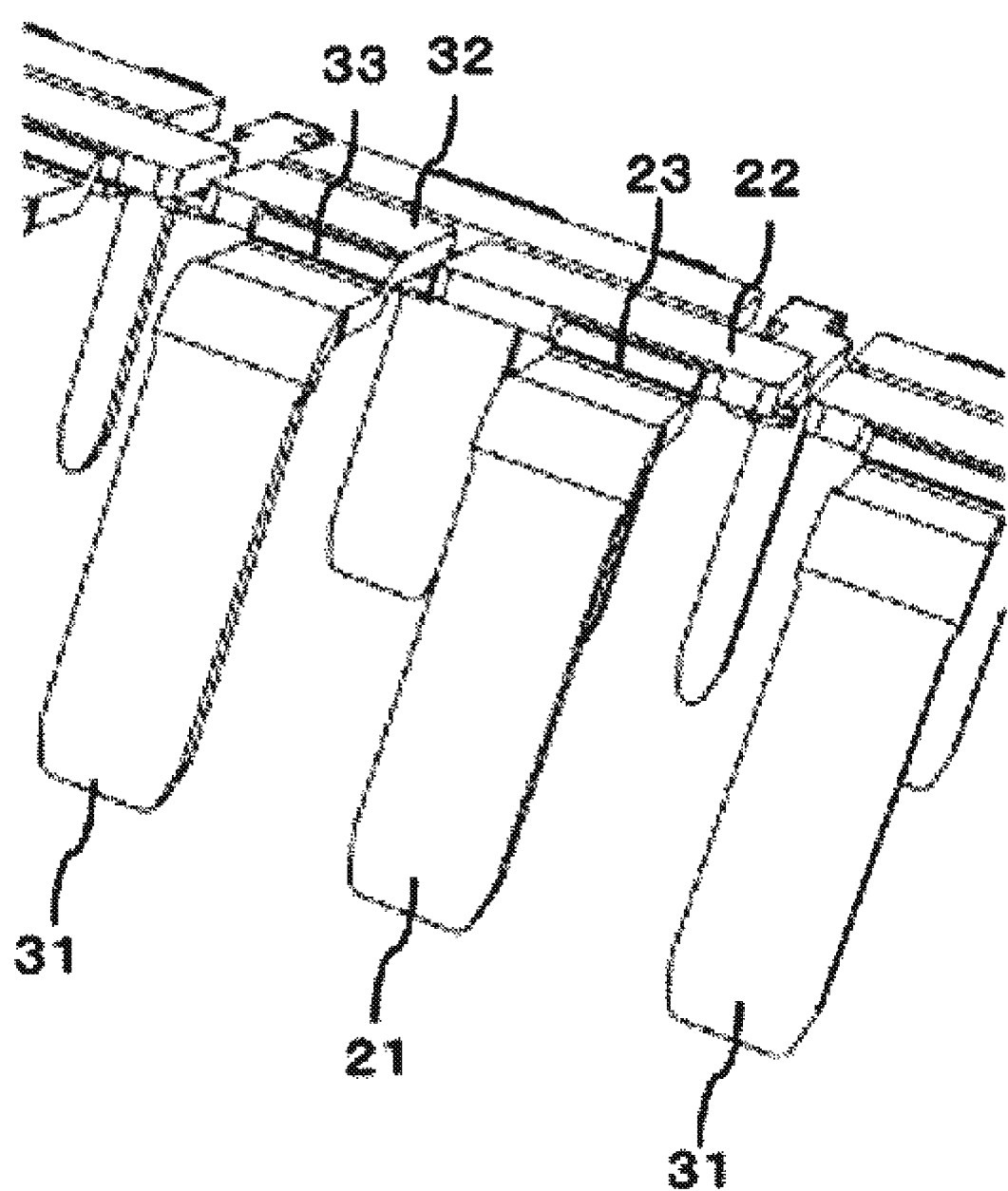
FIG. 7 is a perspective view for illustrating a relationship among components including a second terminal and a third terminal of the electronic module according to the embodiment of the present invention.

As shown in FIGS. 6 and 7, the back-surface exposed conductors 10, 20, and 30 may have inward bent parts 13, 23, and 33 that are respectively integrated with the back-surface exposed parts 12, 22, and 32 and the one-terminal parts 11, 21 and 31, and bend toward inside of the sealing part 90 (are bent toward inside of the sealing part 90). The inward bent parts 13, 23, and 33 may have a first inward bent part 13 provided between the first back-surface exposed part 12 and the first terminal part 11, a second inward bent part 23 provided between the second back-surface exposed part 22 and the second terminal part 21, and a third inward bent part 33 provided between the third back-surface exposed part 32 and the third terminal part 21.

Figure 10:
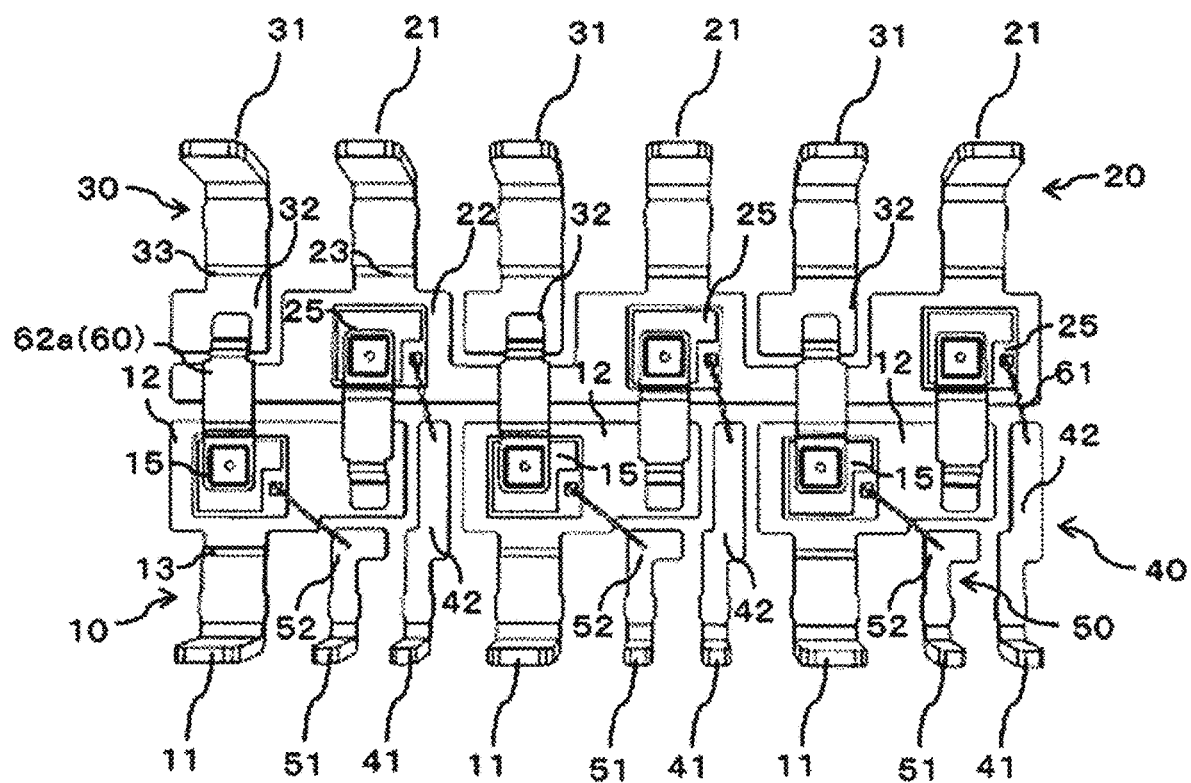
FIG. 10 is a plan view of the electronic module according to the variation of the embodiment of the present invention, from which the sealing part has been removed.

As a variation, the back-surface exposed parts 12, 22, and 32 may have the first back-surface exposed part 12 on which one first electronic element 15 is placed, and the second back-surface exposed part 22 on which a plurality of the second electronic elements 25 is placed, as shown in FIG. 10. When the plurality of second electronic elements 25 is placed on the second back-surface exposed part 22, and a plurality of the second terminal parts 21 is integrally formed with the second back-surface exposed part 22, as described above, the width of the second terminal part 21 may be narrower than that of the first terminal part 11 and/or the third terminal part 31. The width of the second terminal part 21 may correspond to those of the other-terminal parts 41 and 51. Here, the correspondence between the width of the second terminal part 21 and those of the other-terminal parts 41 and 51 refers to the width of the second terminal part 21 falling within the range of the widths W2 of the other-terminal parts 41 and 51 plus or minus 5% (within a range from 0.95× W2 to 1.05× W2). Even in such an aspect, a requirement that "the width of the other-terminal part is narrower than that of the one-terminal part" is met since the widths of the other-terminal parts 41 and 51 are narrower than those of the first terminal part 11 and the second terminal part 12.

The back-surface exposed conductors 10, 20, and 30 and the back-surface unexposed conductors 40 and 50 are made of, for example, copper or copper alloy, and may be entirely or partially plated, for example, tin-plated or nickel-plated. Epoxy resin and the like may be used as the sealing part 90.

Figure 11:
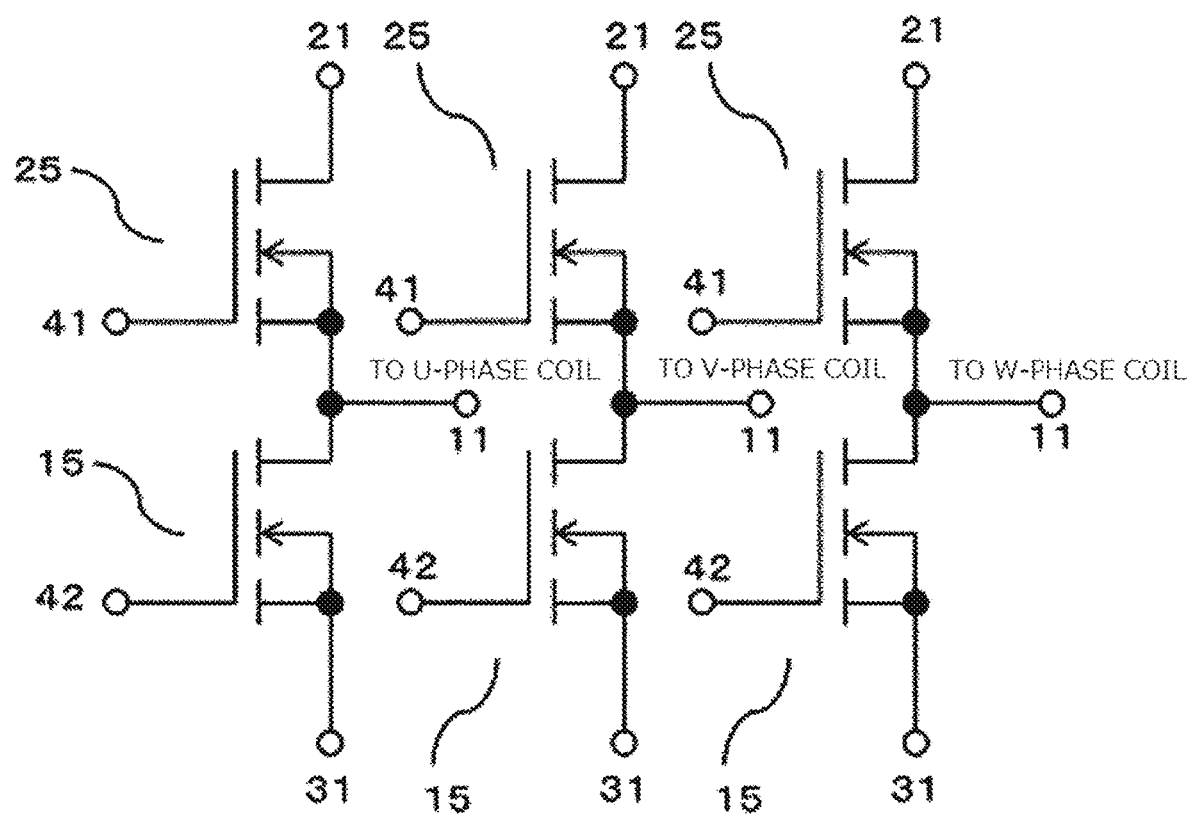
FIG. 11 is a circuit diagram of the electronic module according to the embodiment of the present invention.

For example, a power electronic module may be used as the electronic module. As an example, a MOSFET may be used as the first electronic element 15 and the second electronic element 25. An example of the circuit diagram of the electronic module according to the present embodiment is shown in FIG. 11. In an aspect shown in FIG. 11, the first electronic element 15 and the second electronic element 25 are MOSFETs. A drain of the MOSFET, which is shown as the first electronic element 15 in FIG. 5, is located on the side of the first back-surface exposed part 12, and a source thereof is located on the side (the upper side) opposite to the first back-surface exposed part 12. A drain of the MOSFET, which is shown as the second electronic element 25 in FIG. 5, is located on the side of the second back-surface exposed part 22, and a source thereof is located on the side (the upper side) opposite to the second back-surface exposed part 22.

The first back-surface exposed conductor 10, the second back-surface exposed conductor 20, and the third back-surface exposed conductor 30 may be connected to each other. As an example, the first back-surface exposed part 12 and the second back-surface exposed part 22 may be connected to each other via a connector 62 or a wire 61. In addition, the second back-surface exposed part 22 and the third back-surface exposed conductor 30 may be connected to each other via a connector 62 or a wire 61. It should be noted that, for example, a copper clip can be used as the connector 62, and an aluminum wire can be used as the wire 61. Furthermore, use of the connector 62 having a large width can increase the amount of current flowing therethrough. Moreover, the connector 62 according to the present embodiment may have a first connector 62a and a second connector 62b to be described below.

Figure 12:
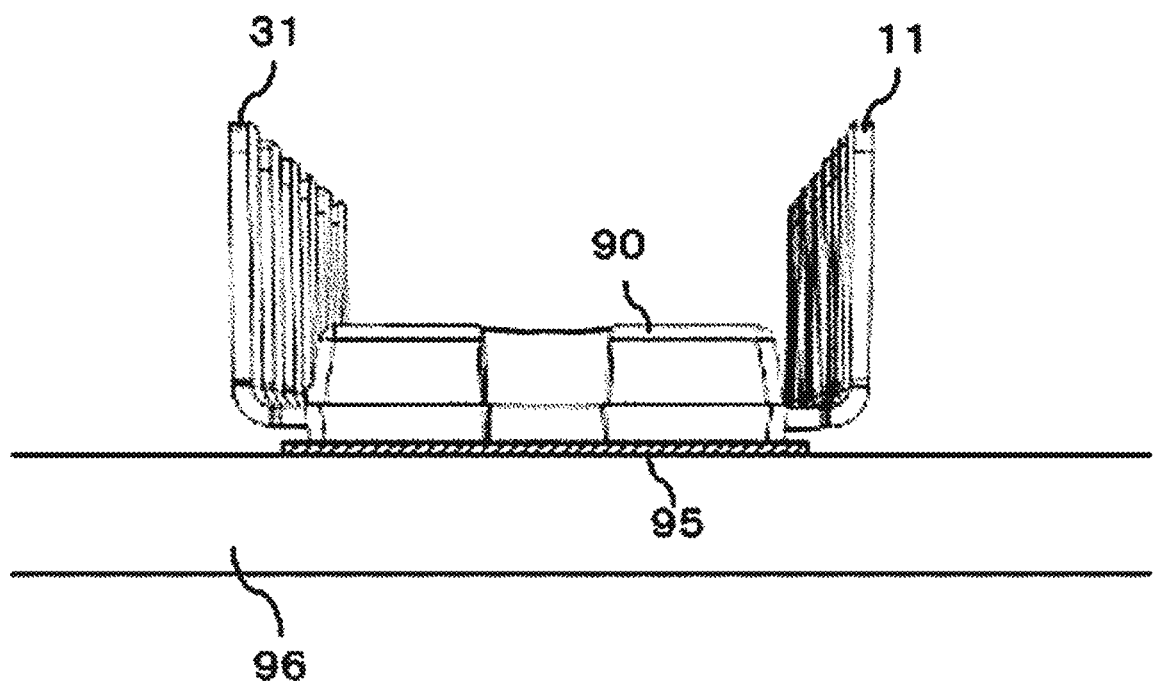
FIG. 12 is a side view showing an aspect of the electronic module according to the embodiment of the present invention, which is placed on a heat dissipation sheet.

As shown in FIG. 12, the first back-surface exposed part 12, the second back-surface exposed part 22, and the third back-surface exposed part 32 may be placed on a housing 96 with a heat dissipation sheet 95, head dissipation adhesive, and the like interposed therebetween.

Figure 8:
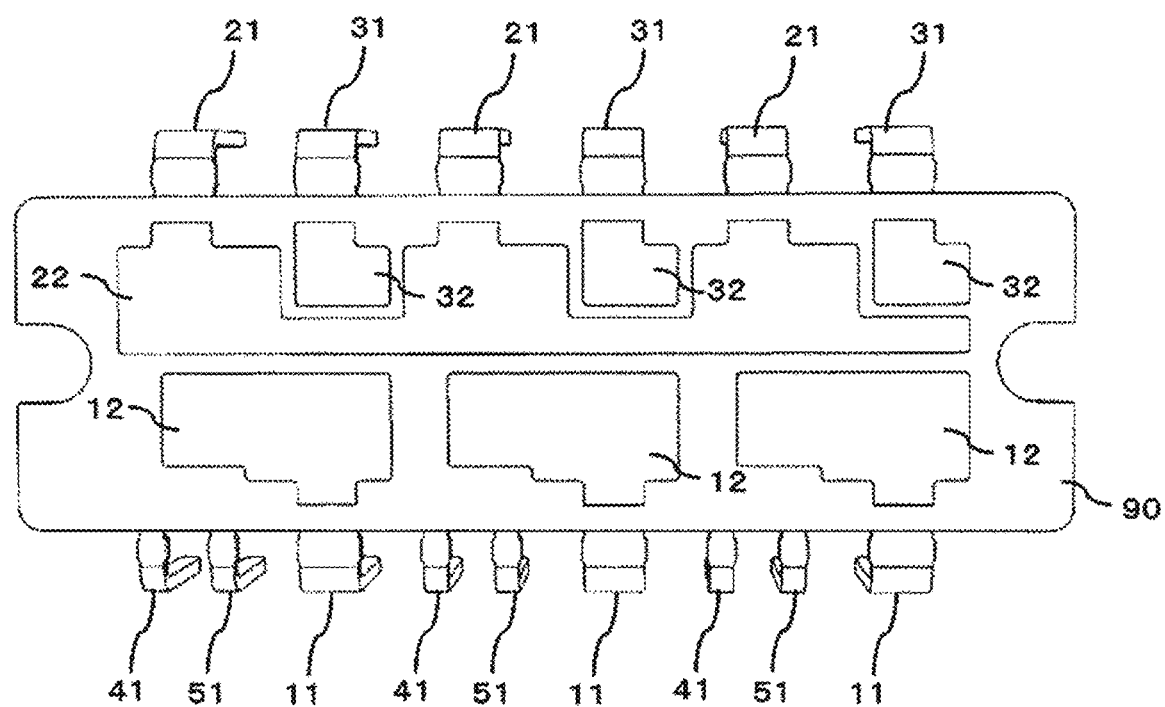
FIG. 8 is a bottom plan view of an electronic module according to a variation of the embodiment of the present invention.

When seen from the back side, as shown in FIGS. 3 and 8, each of the plurality of first back-surface exposed parts 12 may have the same shape. Similarly, when seen from the back side, each of the plurality of second back-surface exposed parts 22 may have the same shape, and each of the plurality of third back-surface exposed parts 32 may also have the same shape. It should be noted that, when seen form the back side, each of the first back-surface exposed part 12, the second back-surface exposed part 22, and the third back-surface exposed part 32 may have the same shape.

When seen from the back side, as shown in FIG. 3, the area of the first back-surface exposed part 12 exposed from the sealing part 90 may be substantially equal to that of the second back-surface exposed part 22 exposed from the sealing part 90. It should be noted that, in the present embodiment, an "area" being "substantially equal" refers to the area falling within the range of the entire area plus or minus 10%. For example, this can be written as $$A2 \times 0.9 \leq A1 \leq A2 \times 1.1,$$

where A1 is the area of apart of the first back-surface exposed part 12 exposed from the back surface, and A2 is the area of a part of the second back-surface exposed part 22 exposed from the back surface. Furthermore, when seen from the back side, the area of the first back-surface exposed part 12 may be substantially equal to that of the third back-surface exposed part 32, and the area of the second back-surface exposed part 22 may also be substantially equal to that of the third back-surface exposed part 32.

Figure 1:
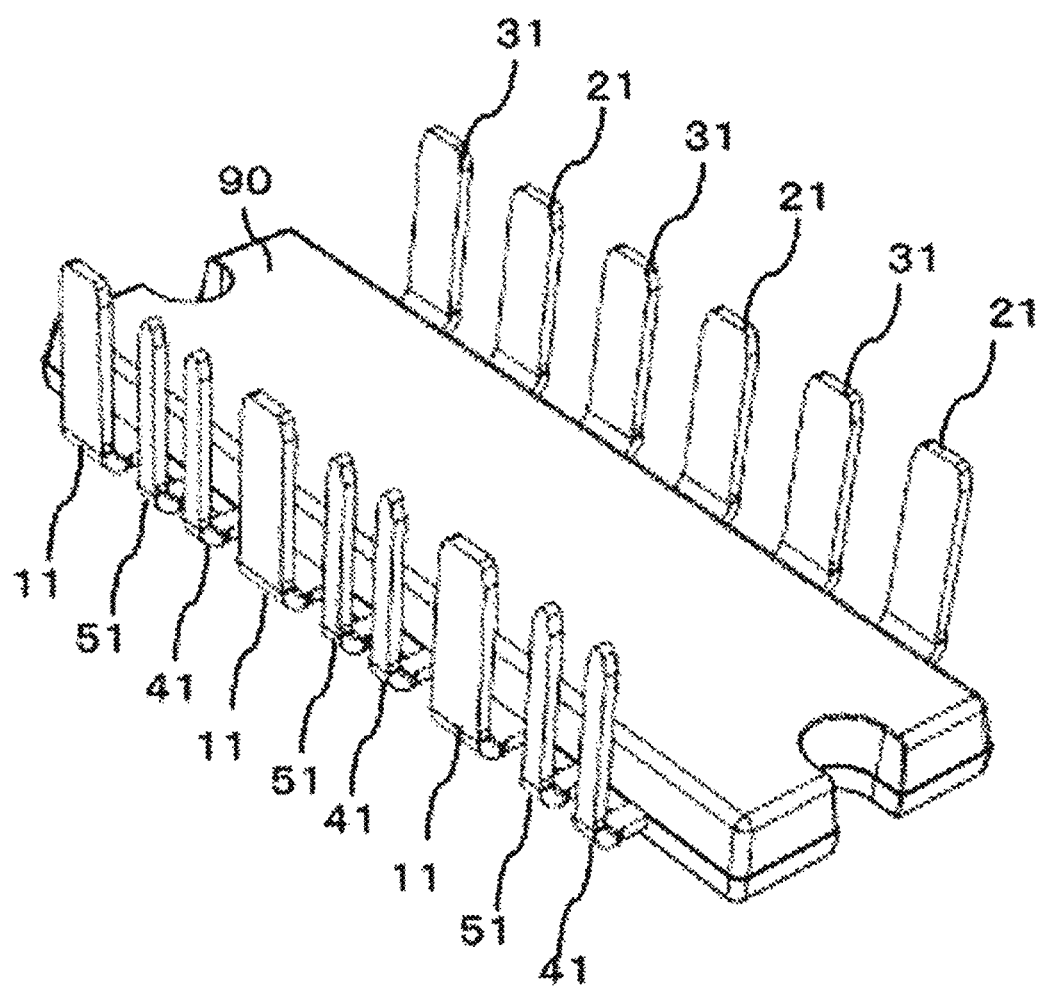
FIG. 1 is a perspective view of an electronic module according to an embodiment of the present invention.
Figure 2:
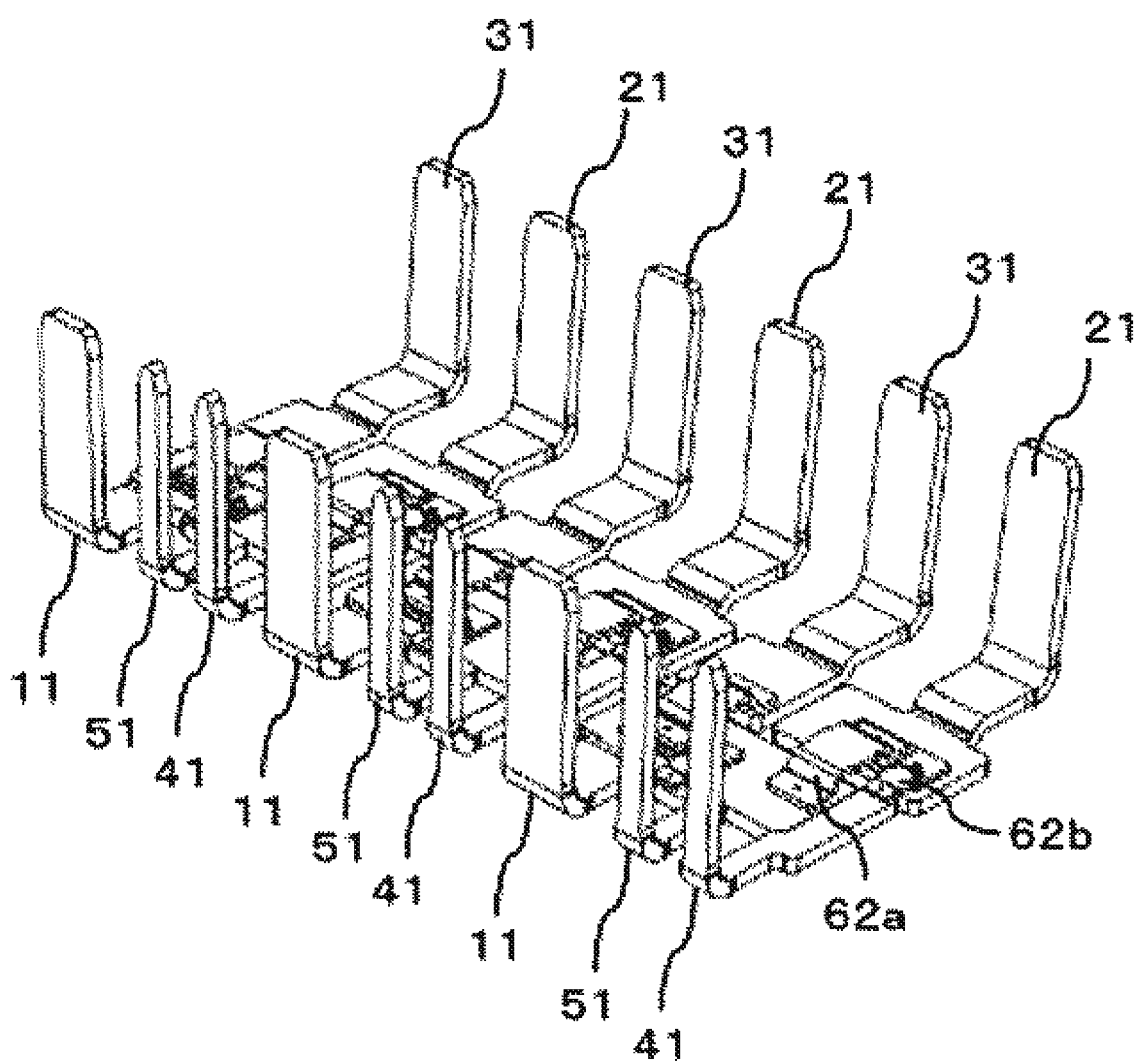
FIG. 2 is a perspective view of the electronic module shown in FIG. 1 from which a sealing part has been removed.

As shown in FIGS. 1 and 2, each of a first terminal 11, a second terminal 21, and a third terminal 31 may be bent toward the upper side (the side of the sealing part 90).

The electronic module according to the present embodiment may be a three-phase bridge circuit. One of three output terminals may be connected to a U-phase coil. Another output terminal may be connected to a V-phase coil. The other output terminal may be connected to a W-phase coil.

More specifically, a MOSFET, which is shown as the second electronic element 25 in FIG. 11, has a drain connected to the side of a power supply line, and a source connected to a drain of a MOSFET, which is shown as the first electronic element 15 in FIG. 11. A source of the latter MOSFET is connected to the ground. Furthermore, a connection point between the second electronic element 25 and the first electronic element 15 is connected to a U-phase coil, a V-phase coil, or a W-phase coil of a motor.

When the inward bent parts 13, 23, and 33 are provided, the second connector 62b, which connects the unexposed parts 42 and 52 and the electronic elements 15 and 25, is located at a height different from that of the first connector 62a, which connects the electronic elements 15 and 25 and the back-surface exposed parts 12, 22, and 32. More specifically, according to the aspect shown in FIG. 5, the connection surface between the second connector 62b and the first unexposed part 42 is located higher than the connection surface between the first connector 62a and the first back-surface exposed part 12 (see FIG. 2).

<<Operation and Effect>>

Next, an undescribed part of operation and effect implemented by the present embodiment having the above configuration will be described below. It should be noted that any aspect to be described in the section "Operation and Effect" can be adopted for the above-described configuration.

In the present embodiment, heat dissipation effect can be expected when an aspect is adopted in which the back-surface exposed parts 12, 22, and 32, on which the electronic elements 15 and 25 are placed, have their back surfaces exposed (see FIGS. 3 and 4). On the contrary, the possibility of the back-surface unexposed conductors 40 and 50 getting out of the sealing part 90 can be reduced when another aspect is adopted in which the unexposed parts 42 and 52 are sealed in the sealing part 90. In such a case, poor appearance of the unexposed parts 42 and 52 is not caused by burr of the sealing part 90 since the unexposed parts 42 and 52 are not exposed from the back surface. Generally, it is difficult to hold a part having a narrow width when sealing with resin, and thus burr is likely to occur at the sealing part 90. Meanwhile, adopting the unexposed parts 42 and 52, which are not exposed to the outside, is advantageous also in the respect that no burr is caused. Additionally, in this case, the other-terminal parts 41 and 51 are sealed in the sealing part 90, while the electronic elements 15 and 25 are placed on the back-surface exposed parts 12, 22, and 32 having exposed back surfaces (the first back-surface exposed part 12 in the present embodiment). As a result, the other-terminal parts 41 and 51 can be separated from the electronic elements 15 and 25 (the first electronic element 15 in the present embodiment) in the thickness direction. This can prevent current flowing through the other-terminal parts 41 and 51 from being adversely affected by, for example, heat generated by the electronic elements 15 and 25.

When an aspect of having the inward bent parts 13, 23, and 33 as shown in FIGS. 6 and 7 is adopted, circumferential parts of the back-surface exposed conductors 10, 20, and 30 are sealed in the sealing part 90, as shown in FIG. 3. This can surely prevent the back-surface exposed conductors 10, 20, and 30 from getting out of the sealing part 90. Moreover, in another aspect, the inward bent parts 13, 23, and 33 are employed, and the back surface of the sealing part 90 is in a flat shape. Adopting this aspect can prevent a conductor face from being exposed at the circumferential part of the back surface of the sealing part 90, without providing a protrusion and the like on the back surface of the sealing part 90. This is advantageous also in the respect that it is unnecessary to process a heatsink, the housing 96, and others in accordance with the protrusion.

It should be noted that when a conductor face is exposed at the circumferential part of the back surface of the sealing part 90, there is a possibility that current leaks from an unexpected location. Meanwhile, the conductor face can be prevented from being exposed at the circumferential part of the back surface of the sealing part 90, by adopting the inward bent parts 13, 23, and 33, as disclosed in the present embodiment. This is advantageous in the respect of reducing the possibility of the leakage of current from an unexpected location, and enhancing the reliability. Furthermore, the adoption of the inward bent parts 13, 23, and 33, as described above, achieves the following. While the one-terminal parts 11, 21, and 31 are kept in accordance with the other-terminal parts 41 and 51 with respect to the position in the height direction, the back-surface exposed parts 12, 22, and 32 (the first back-surface exposed part 12 in the present embodiment) and the unexposed parts 42 and 52 can be separated from each other. This leads to the electronic elements 15 and 25 (the first electronic element 15 in the present embodiment) being separated from the unexposed parts 42 and 52, and thus current flowing through the other-terminal parts 41 and 51 can be prevented from being adversely affected by heat generated by the electronic elements 15 and 25.

In addition, preventing the conductor face from being exposed at the circumferential part of the back surface of the sealing part 90 can reduce the size of the heat dissipation sheet 95, and can also reduce manufacturing costs.

When an aspect is adopted in which the first electronic element 15 is placed on the first back-surface exposed part 12 having its back surface exposed, as shown in FIGS. 5 and 10, heat generated by the first electronic element 15 can be efficiently dissipated. Similarly, when an aspect is adopted in which the second electronic element 25 is placed on the second back-surface exposed part 22 having its back surface exposed, heat generated by the second electronic element 25 can be efficiently dissipated.

In another aspect, the first back-surface exposed part 12 on which the first electronic element 15 is placed, and the unexposed parts 42 and 52 on which the electronic elements 15 and 25 are not placed are positioned on one side (one side with respect to the center in the transverse direction). Adopting this aspect is advantageous in the respect that heat generated by the first electronic element 15 can be efficiently dissipated from the first back-surface exposed part 12 on the one side of the back surface.

Figure 9:
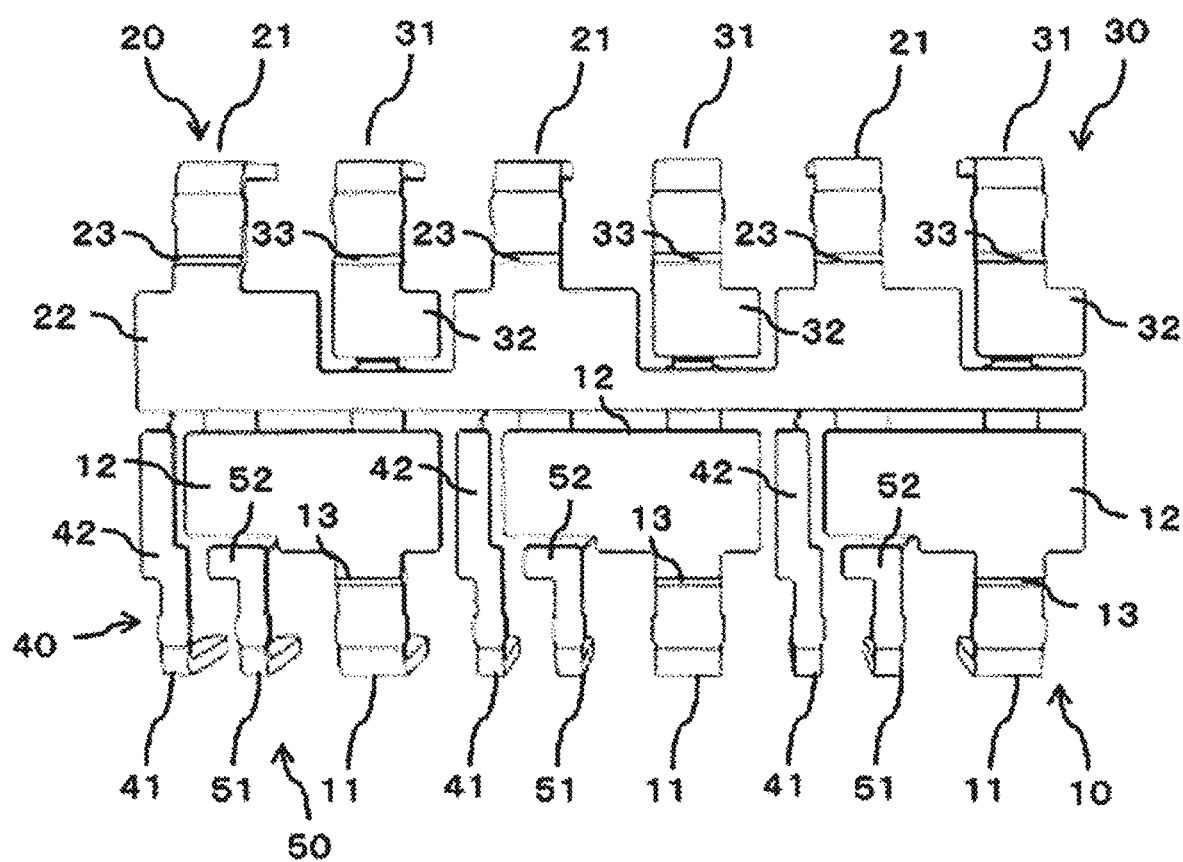
FIG. 9 is a bottom plan view of the electronic module shown in FIG. 8 from which a sealing part has been removed.

When an aspect is adopted in which the fourth terminal part 41 and the fifth terminal part 51 are provided between the first terminal parts 11, as shown in FIGS. 4 and 9, it is possible to arrange, in a well-balanced manner, the first terminal part 11 easily affected by heat generated by the first electronic element 15, and the fourth terminal part 41 and the fifth terminal part 51 less likely to be affected by heat generated by the electronic elements 15 and 25. Therefore, heat generated by the first electronic element 15 can be efficiently dissipated through the first terminal part 11.

When an aspect is adopted in which the unexposed parts 42 and 52 are provided between a pair of the first back-surface exposed parts 12, it is possible to arrange, in a well-balanced manner, the first back-surface exposed part 12 on which the first electronic element 15 is placed, and the unexposed parts 42 and 52 on which the electronic elements 15 and 25 are not arranged. Thus, heat generated by the first electronic element 15 can be efficiently dissipated through the first back-surface exposed part 12.

In another aspect, the first unexposed part 42 is provided between a pair of the first back-surface exposed parts 12, and the second unexposed part 52 is provided at one side of the first back-surface exposed part 12. Adopting this aspect is advantageous in the respect that the first unexposed part 42 and the second unexposed part 52 can be provided while the size of the first back-surface exposed part 12 is kept as large as possible.

In another aspect, the second back-surface exposed part 22 on which the second electronic element 25 is placed, and the third back-surface exposed part 32 on which the electronic elements 15 and 25 are not placed, are positioned on the other side (the other side with respect to the center in the transverse direction), as shown in FIGS. 5 and 10. Adopting this aspect is advantageous in the respect that heat generated by the second electronic element 25 can be efficiently dissipated through the second back-surface exposed part 22 on the other side of the back surface.

When an aspect is adopted in which the second terminal part 21 and the third terminal part 31 are alternately arranged as shown in FIGS. 4 and 9, it is possible to arrange, in a well-balanced manner, the second terminal part 21 easily affected by heat generated by the second electronic element 25, and the third terminal part 31 less likely to be affected by heat generated by the electronic elements 15 and 25. Thus, heat generated by the second electronic element 25 can be efficiently dissipated through the second terminal part 21.

When an aspect is adopted in which the second back-surface exposed part 22 and the third back-surface exposed part 32 are alternately arranged as shown in FIG. 4, it is possible to arrange, in a well-balanced manner, the second back-surface exposed part 22 on which the second electronic element 25 is placed, and the third back-surface exposed part 32 on which the electronic elements 15 and 25 are not arranged. Therefore, heat generated by the second electronic element 25 can be efficiently dissipated from the second back-surface exposed part 22.

Adopting an aspect of the second back-surface exposed part 22 being provided with a plurality of the second terminal parts 21, as shown in FIG. 9, can achieve a structure that makes the second back-surface exposed body less likely to slip off the sealing part 90. Alternatively, it is possible to adopt an aspect in which, instead of the second back-surface exposed part 22, the first back-surface exposed part 12 is provided with a plurality of the first terminal parts 11. It is also possible to adopt an aspect in which the third back-surface exposed part 32 is provided with a plurality of the third terminal parts 31.

When an aspect is adopted in which the first back-surface exposed part 12, the second back-surface exposed part 22, and the third back-surface exposed part are configured separately from each other, as shown in FIG. 4, it is possible to make terminal parts less likely to be affected by high-frequency waves (noise and others), arising from the other terminal parts. The influence of high-frequency waves (noise and others) can be a problem especially for a three-phase bridge circuit. In this respect, it is very advantageous for a three-phase bridge circuit to adopt the aspect in which the first back-surface exposed part 12, the second back-surface exposed part 22, and the third back-surface exposed part are configured separately from each other.

Heat can be dissipated uniformly by a plurality of the electronic elements 15 and 25 being evenly arrayed, as shown in FIGS. 5 and 10. Furthermore, the electronic elements 15 and 25 can be mounted rapidly, and productivity can be enhanced, by the plurality of electronic elements 15 and 25 evenly arrayed in a manner described above. In the present embodiment, the term "even" refers to the following state. The distances between the plurality of first electronic elements 15 are equal. The distances between the plurality of second electronic elements 25 are equal. The plurality of first electronic elements 15 is arranged on one side (the lower side in FIGS. 5 and 10) with respect to the center line extending in the longitudinal direction of the electronic module (the horizontal direction in FIGS. 5 and 10). The plurality of second electronic elements 25 is arranged on the other side (the upper side in FIGS. 5 and 10) with respect to the center line. In addition, the first electronic elements 15 and the second electronic elements 25 are arranged in a nested manner. As an example, the plurality of (three in the aspect shown in FIGS. 5 and 10) first electronic elements 15 may be arranged at equal intervals in the horizontal direction on the lower side shown in FIGS. 5 and 10, with respect to the center line in the longitudinal direction of the electronic module. The plurality of (three in the aspect shown in FIGS. 5 and 10) second electronic elements 25 may be arranged at equal intervals in the horizontal direction on the upper side shown in FIGS. 5 and 10, with respect to the center line in the longitudinal direction. In addition, the first electronic elements 15 and the second electronic elements 25 may be arranged in a nested manner.

This is advantageous when the wire 61 is adopted, in the respect that the wire 61 can be connected efficiently by the plurality of electronic elements 15 and 25 being evenly arrayed, as shown in FIG. 10.

When the connector 62 such as a clip is used, the connector 62 needs to be prepared in advance. Meanwhile, it is possible to reduce the number of types of the connectors 62 to be prepared, by evenly arraying the plurality of electronic elements 15 and 25. As an example, according to the aspect shown in FIGS. 5 and 10, the length of the first connector 62a which connects the upper side of the first electronic element 15 and the third back-surface exposed part 32 can be approximately equal to that of the first connector 62a which connects the upper side of the second electronic element 25 and the second back-surface exposed part 22. Therefore, this is advantageous in the respect that the number of types of the first connectors 62a, which connect the electronic elements 15 and 25 and the back-surface exposed parts 12, 22, and 32, can be reduced to, for example, one. Furthermore, this is also advantageous in the respect that the amount of current flowing through each of the first connectors 62a can be kept at approximately the same value, if the number of types of the first connectors 62a, which connect the electronic elements 15 and 25 and the back-surface exposed parts 12, 22, and 32, is reduced to one in a manner described above.

Moreover, in an aspect, the first unexposed part 42 is provided between a pair of the first back-surface exposed parts 12, and the second unexposed part 52 is provided at one side of the first back-surface exposed part 12, as shown in FIG. 5. When this aspect is adopted, the length of the second connector 62b which connects the first unexposed part 42 and the upper side of the second electronic element 25 can be approximately equal to that of the second connector 62b which connects the second unexposed part 52 and the upper side of the first electronic element 15. Thus, this is advantageous in the respect that the number of types of the second connectors 62b that connect the unexposed parts 42 and 52 and the electronic elements 15 and 25 can be reduced to, for example, one. Additionally, this is advantageous in the respect that when the electronic elements 15 and 25 are identical, the electronic elements 15 and 25 can be controlled by equal current, by reducing, to one, the number of types of the second connectors 62b that connect the unexposed parts 42 and 52 and the electronic elements 15 and 25 in a manner described above.

In the case where the plurality of first back-surface exposed parts 12 has the same shape when seen from the back side as shown in FIG. 3, there are advantages as follows. It is possible to conform electrical characteristics of each of the first back-surface exposed parts 12 by, for example, making the amount of current flowing therethrough agree with each other, and is also possible to conform heat dissipation characteristics thereof. Similarly, in the case where the plurality of second back-surface exposed parts 22 has the same shape, there are advantages as follows. It is possible to conform electrical characteristics of each of the second back-surface exposed parts 22 by, for example, making the amount of current flowing therethrough agree with each other, and is also possible to conform heat dissipation characteristics thereof. Furthermore, in the case where the plurality of third back-surface exposed parts 32 has the same shape, there are advantages as follows. It is possible to conform electrical characteristics of each of the third back-surface exposed parts 32 by, for example, making the amount of current flowing therethrough agree with each other, and is also possible to conform heat dissipation characteristics thereof.

As an example, it is possible to use the second terminal 21 as an input terminal, the first terminal 11 as an output terminal, and the third terminal 31 as a ground terminal, by connecting the upper side of the second electronic element 25 to the first back-surface exposed part 12, and also by connecting the upper side of the first electronic element 15 to the third back-surface exposed part 32, as shown in FIGS. 5 and 10. Therefore, current input from one side in the transverse direction of the electronic module (the upper side in FIGS. 5 and 10) can flow to the other side in the transverse direction of the electronic module (the lower side in FIGS. 5 and 10), and thus current does not turn around, unlike in the case of the configuration disclosed in U.S. Pat. No. 5,067,679. Thus, the length of wiring can be reduced, resulting in reduction of impedance and inductance. Furthermore, the electronic module can be downsized, and costs can be reduced.

Finally, description of the embodiment and variation given above and disclosure of the drawings give just an example to illustrate the invention described in Claims. The invention described in Claims is not limited by the description of the embodiment and variation given above or the disclosure of the drawings. In addition, description of the claim as originally filed gives just an example. The description of the claim can be changed, based on description of the specification, the drawings and others, when necessary.

REFERENCE SIGNS LIST

10 First back-surface exposed conductor
11 First terminal (one-terminal part)
12 First back-surface exposed part (back-surface exposed part)
13 First inward bent part (inward bent part)
15 First electronic element (electronic element)
20 Second back-surface exposed conductor
21 Second terminal (one-terminal part)
22 Second back-surface exposed part (back-surface exposed part)
23 Second inward bent part (inward bent part)
25 Second electronic element (electronic element)
30 Third back-surface exposed conductor
31 Third terminal (one-terminal part)
32 Third back-surface exposed part (back-surface exposed part)
33 Third inward bent part (inward bent part)
40 First back-surface unexposed conductor (back-surface unexposed conductor)
41 Fourth terminal part (other-terminal part)
42 First unexposed part (unexposed part)
50 Second back-surface unexposed conductor (back-surface unexposed conductor)
51 Fifth terminal part (other-terminal part)
52 Second unexposed part (unexposed part)
61 Wire
62 Connector
62a First connector
62b Second connector
90 Sealing part

The invention claimed is:

1. An electronic module comprising:
a sealing part;
an electronic element provided in the sealing part;
a back-surface exposed conductor having a back-surface exposed part, which has a back surface exposed from the sealing part, and having a one-terminal part, which extends from the back-surface exposed part and protrudes outward from a side of the sealing part; and
a back-surface unexposed conductor having an unexposed part, which is sealed in the sealing part, and having an other-terminal part, which extends from the unexposed part and protrudes outward from a side of the sealing part; wherein
the electronic element is placed on the back-surface exposed part,
the other-terminal part has a width narrower than a width of the one-terminal part,
the back-surface unexposed conductor and the back-surface exposed conductor do not overlap as seen along a thickness direction,
the back-surface exposed conductor has an inward bent part, which is provided between the back-surface exposed part and the one-terminal part, and bends toward inside of the sealing part, and
the back-surface unexposed conductor has no inward bent part.

2. The electronic module according to claim 1, wherein the back-surface exposed part has a first back-surface exposed part on which the electronic element is placed, the one-terminal part has a first terminal part extended from the first back-surface exposed part, and the first terminal part and the other-terminal part protrude outward from one side of the sealing part.

3. The electronic module according to claim 2, wherein a plurality of the first terminal parts are provided, the other-terminal part has a fourth terminal part and a fifth terminal part, and one each of the fourth terminal part and the fifth terminal part is provided between at least a pair of the first terminal parts.

4. The electronic module according to claim 2, wherein a plurality of the first back-surface exposed parts are provided, and at least one the unexposed part is provided between at least a pair of the first back-surface exposed parts.

5. The electronic module according to claim 1, wherein the back-surface exposed part has a second back-surface exposed part on which the electronic element is placed, and has a third back-surface exposed part on which the electronic element is not placed, the one-terminal part has a second terminal part extended from the second back-surface exposed part and a third terminal part extended from the third back-surface exposed part, and the second terminal part and the third terminal part protrude outward from another side of the sealing part.

6. The electronic module according to claim 5, wherein the second terminal part and the third terminal part are alternately arranged.

* * * * *